United States Patent
Kim et al.

(10) Patent No.: US 10,793,775 B2
(45) Date of Patent: Oct. 6, 2020

(54) ETCHING COMPOSITION AND METHOD FOR FABRICATING SEMICONDUCTOR DEVICE BY USING THE SAME

(71) Applicants: Samsung Electronics Co., Ltd., Suwon-si, Gyeonggi-do (KR); Soulbrain Co., Ltd., Seongnam-si, Gyeonggi-do (KR)

(72) Inventors: Soo Jin Kim, Seoul (KR); Hyo Sun Lee, Daejeon (KR); Jin Hye Bae, Suwon-si (KR); Jung Hun Lim, Daejeon (KR); Yong Jae Choi, Gyeongsangbuk-do (KR)

(73) Assignees: Samsung Electronics Co., Ltd., Gyeonggi-do (KR); Soulbrain Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/543,999

(22) Filed: Aug. 19, 2019

(65) Prior Publication Data
US 2019/0390111 A1   Dec. 26, 2019

Related U.S. Application Data

(62) Division of application No. 15/804,422, filed on Nov. 6, 2017, now Pat. No. 10,414,978.

(30) Foreign Application Priority Data

Dec. 14, 2016   (KR) .................. 10-2016-0170440

(51) Int. Cl.
   *C09K 13/08*   (2006.01)
   *H01L 21/306*   (2006.01)
   (Continued)

(52) U.S. Cl.
   CPC .............. *C09K 13/08* (2013.01); *B82Y 10/00* (2013.01); *C09K 13/00* (2013.01); *H01L 21/30604* (2013.01); *H01L 21/32134* (2013.01); *H01L 29/0653* (2013.01); *H01L 29/0673* (2013.01); *H01L 29/423* (2013.01); *H01L 29/42364* (2013.01); *H01L 29/66* (2013.01); *H01L 29/66439* (2013.01); *H01L 29/66772* (2013.01); *H01L 29/775* (2013.01); *H01L 29/78* (2013.01); *H01L 29/785* (2013.01);
   (Continued)

(58) Field of Classification Search
   None
   See application file for complete search history.

(56) References Cited

U.S. PATENT DOCUMENTS

| 3,677,848 A | 7/1972 | Stoller et al. |
| 5,277,835 A | 1/1994 | Ohmi et al. |

(Continued)

FOREIGN PATENT DOCUMENTS

| EP | 0405886 A2 | 1/1991 |
| JP | 2007227602 A | 9/2007 |

(Continued)

*Primary Examiner* — Jiong-Ping Lu
(74) *Attorney, Agent, or Firm* — Harness, Dickey & Pierce, P.L.C.

(57) ABSTRACT

An etching composition may include a peracetic acid mixture, a fluorine compound, an organic solvent (e.g., acetate-series organic solvent), and water. The etching composition may be used to selectively etch silicon-germanium (SiGe).

13 Claims, 16 Drawing Sheets

(51) Int. Cl.
*H01L 21/3213*   (2006.01)
*B82Y 10/00*     (2011.01)
*C09K 13/00*     (2006.01)
*H01L 29/06*     (2006.01)
*H01L 29/423*    (2006.01)
*H01L 29/66*     (2006.01)
*H01L 29/775*    (2006.01)
*H01L 29/78*     (2006.01)
*H01L 29/786*    (2006.01)

(52) U.S. Cl.
CPC .. *H01L 29/78654* (2013.01); *H01L 29/78696* (2013.01); *H01L 29/42392* (2013.01); *H01L 29/66545* (2013.01); *H01L 29/66795* (2013.01)

(56) References Cited

U.S. PATENT DOCUMENTS

| | | |
|---|---|---|
| 7,176,041 B2 | 2/2007 | Lee et al. |
| 7,229,884 B2 | 6/2007 | Park |
| 7,309,635 B2 | 12/2007 | Park |
| 7,381,601 B2 | 6/2008 | Kim et al. |
| 7,648,883 B2 | 1/2010 | Park |
| 7,666,795 B2 | 2/2010 | Kato et al. |
| 7,709,277 B2 | 5/2010 | Lee et al. |
| 7,776,745 B2 | 8/2010 | Loubet et al. |
| 8,293,608 B2 | 10/2012 | Orlowski et al. |
| 8,461,055 B2 | 6/2013 | Radouane et al. |
| 9,373,503 B2 | 6/2016 | Iancu et al. |
| 2007/0082470 A1 | 4/2007 | Fitzgerald et al. |
| 2007/0111474 A1 | 5/2007 | Delattre et al. |
| 2008/0038932 A1* | 2/2008 | Wagner ............ C09K 13/08 438/753 |
| 2013/0109191 A1* | 5/2013 | Le Tiec ............ H01L 21/30604 438/752 |

FOREIGN PATENT DOCUMENTS

| | | |
|---|---|---|
| KR | 19910006458 | 4/1991 |
| KR | 100625177 B1 | 9/2006 |
| KR | 100788348 B1 | 1/2008 |

* cited by examiner

ETCHING COMPOSITION AND METHOD FOR FABRICATING SEMICONDUCTOR DEVICE BY USING THE SAME

CROSS-REFERENCE TO RELATED APPLICATION

This application is a divisional of U.S. application Ser. No. 15/804,422, filed on Nov. 6, 2017 (now U.S. Pat. No. 10,414,978, issued on Sep. 17, 2019), which claims priority from Korean Patent Application No. 10-2016-0170440, filed on Dec. 14, 2016 in the Korean Intellectual Property Office, and all the benefits accruing therefrom under 35 U.S.C. 119, the contents of each of which in their entirety are herein incorporated by reference.

BACKGROUND

1. Technical Field

The present disclosure relates to an etching composition and/or a method for fabricating a semiconductor device by using the same, and more particularly, to an etching composition provided to selectively remove silicon-germanium from a stack structure including a silicon film and a silicon-germanium film, and a method for fabricating a semiconductor device by using the same.

2. Description of Related Art

The recent dramatic increase in the distribution of information media has led into remarkable advancement in the functionalities of semiconductor devices. To ensure higher competitiveness, new semiconductor products are being developed to meet demands for lower cost and higher quality by way of higher integration. The semiconductor scale-down continues to achieve higher integration.

For semiconductor device density enhancement, the gate-all-around structure has been suggested as one of the scaling technologies, according to which a silicon body in a nanowire shape is formed on a substrate, with a gate then being formed to surround the silicon body.

Meanwhile, in wet process of a method for fabricating a semiconductor device, hydrofluoric acid or mixture solution of hydrofluoric acid and ammonium fluoride may be used for the purpose of cleaning and etching a silicon oxide film, a silicon-germanium thin film, a gallium arsenide thin film, and so on.

Further, because the next generation semiconductor device fabricating process continuously miniaturizes the semiconductor device, there is interest in developing an etching composition for a wet process that has a high etch selectivity with respect to a thin film material. One etching composition, as described in Korean Publication Patent No. 1991-0006458, to optimize a chemical composition of hydrofluoric acid and ammonium fluoride for efficiently etching a semiconductor silicon film has been used in the semiconductor device fabricating process.

However, the existing etching composition has a shortcoming for etch selectivity between a polysilicon film and a SiGe film (where, etch selectivity is obtained by dividing etch rate of SiGe by etch rate of the polysilicon film).

SUMMARY

Inventive concepts relates to an etching composition that may be used for removing a silicon-germanium film with high etch selectivity, from a stack structure including a silicon film and a silicon-germanium film.

Inventive concepts relate to a method for fabricating a semiconductor device by using an etching composition for removing a silicon-germanium film with high etch selectivity, from a stack structure including a silicon film and a silicon-germanium film.

Features and effects are not limited to those set forth above and other features and effects than those set forth above will be clearly understood to a person skilled in the art from the following description.

According to some example embodiments of inventive concepts, an etching composition may include a peracetic acid mixture, a fluorine compound, an acetate series organic solvent, and water. The etching composition may be used to selectively remove silicon-germanium (SiGe).

According to some example embodiments of inventive concepts, an etching composition may include, based on a total weight of the etching composition, 15 wt % to 75 wt % of a peracetic acid mixture, 0.01 wt % to 5 wt % of a fluorine compound, 15 wt % to 65 wt % of an organic solvent, and water. A sum of respective amounts of the peracetic acid mixture, the fluorine compound, and the organic solvent may be less than the total weight of the etching composition.

According to some example embodiments of inventive concepts, a method for fabricating a semiconductor device may include forming a fin-type structure including a silicon pattern and a silicon-germanium pattern which are alternately stacked; forming a dummy gate electrode on the fin-type structure, the dummy gate electrode intersecting the fin-type structure; forming a first spacer on a sidewall of the dummy gate electrode; forming an interlayer insulating film that surrounds a sidewall of the first spacer and exposes an upper surface of the dummy gate electrode; forming a trench exposing the fin-type structure within the interlayer insulating film, by removing the dummy gate electrode; and forming a wire pattern using the etching composition, the forming the wiring pattern including the silicon pattern, the forming the wiring pattern including removing the silicon-germanium pattern with wet etching from the fin-type structure exposed by the trench, the wet etching including using the etching composition. The etching composition may include a peracetic acid mixture, a fluorine compound, an acetate series organic solvent, and water.

According to some example embodiments of inventive concepts, an etching composition may include a peracetic acid mixture, a fluorine compound, and an organic solvent.

BRIEF DESCRIPTION OF THE DRAWINGS

The above and other objects, features and effects of inventive concepts will become more apparent to those of ordinary skill in the art by describing in detail example embodiments thereof with reference to the accompanying drawings.

DETAILED DESCRIPTION

Figure 1:
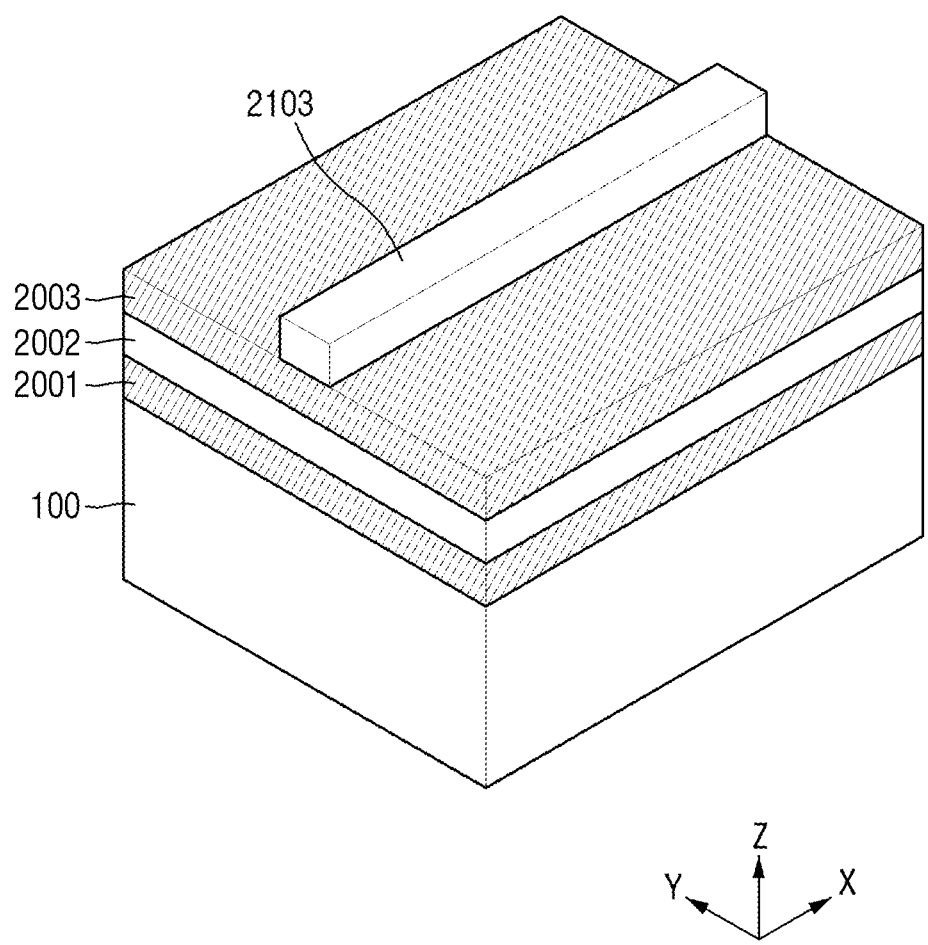
FIGS. 1 to 18 are views illustrating intermediate stages of fabrication, provided to explain a method for fabricating a semiconductor device by using an etching composition according to some example embodiments of present disclosure.

Some example embodiments will be described hereinafter with reference to the accompanying drawings, which illustrating intermediate stages of fabrication. As used herein, the term "alkyl" represents an aliphatic hydrocarbon group. An alkyl part may be a "saturated alkyl" group, representing that an alkene or alkyne part is not included. The alkyl part may be an "unsaturated alkyl" part, representing that at least one alkene or alkyne part is included. The "alkene" part represents a group in which at least two carbon atoms are formed with at least one carbon-carbon double bond, and the "alkyne" part represents a group in which at least two carbon atoms are formed with at least one carbon-carbon triple bond.

An alkyl group may be substituted or unsubstituted. When substituted, a substituted group may include one or more groups separately and independently selected from cycloalkyl, aryl, heteroaryl, heteroalicyclic, hydroxy, alkoxy, aryloxy, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, O-carboxy, isocyanato, thiocyanato, isothiocyanato, nitro, silyl, trihalomethanesulfonyl, amino including mono- and di-substituted amino groups, and protected derivatives thereof. A typical alkyl group may include methyl, ethyl, propyl, isopropyl, butyl, isobutyl, tertiary butyl, pentyl, hexyl, ethenyl, propenyl, butenyl, cyclopropyl, cyclobutyl, cyclopentyl, cyclohexyl, or the like, but not limited hereto.

For example, an etching composition which will be described below may be embodied as an etching solution to etch silicon-germanium.

For another example, the etching composition which will be described below may be etching solution to selectively remove a silicon-germanium film from a stack structure including a silicon film and the silicon-germanium film.

An etching composition according to some example embodiments may include a peracetic acid ($CH_3COOOH$) mixture, a fluorine compound, an organic solvent, and water. The amount of peracetic acid mixture may be greater than the amount of the fluorine compound.

The etching composition includes the peracetic acid mixture. Peracetic acid included in the peracetic acid mixture may act as an oxidizing agent.

Peracetic acid may break Si—Ge bond at a surface of the silicon-germanium (SiGe) thin film, oxidizing silicon-germanium into $SiO_2$ and $GeO_2$.

Peracetic acid may be prepared by mixing acetic acid ($CH_3COOH$) and hydrogen peroxide ($H_2O_2$). Peracetic acid may be prepared by mixing acetic acid and hydrogen peroxide with a volume ratio of 33:10 (where, acetic acid is 33 and hydrogen peroxide is 10) to 33:33. In some example embodiments, peracetic acid may be prepared by mixing acetic acid and hydrogen peroxide with a volume ratio of 33:20 to 33:30.

In an example, for acetic acid used in the preparation of peracetic acid, an acetic aqueous solution of 100 percent concentration (mass percent of solute to solution) may be used, and for hydrogen peroxide used in the preparation of peracetic acid, a hydrogen peroxide aqueous solution of 31 percent concentration may be used.

Meanwhile, when acetic acid and hydrogen peroxide of different percent concentrations from those described above are used in the preparation of peracetic acid, a volume ratio of acetic acid to hydrogen peroxide may change according to a percent concentration of acetic acid and/or a percent concentration of hydrogen peroxide.

When acetic acid and hydrogen peroxide are mixed, the mixture of peracetic acid, acetic acid and hydrogen peroxide may be produced according to chemical equilibrium. That is, the peracetic acid mixture may include peracetic acid, acetic acid, and hydrogen peroxide.

In the peracetic acid mixture, content of peracetic acid may be 40 wt % to 60 wt % with respect to a total weight of the peracetic acid mixture. The peracetic acid mixture may include acetic acid, hydrogen peroxide, and water (hereinbelow, "water in first state") as well as peracetic acid. The water included in the peracetic acid mixture may include water included in the hydrogen peroxide solution used in the preparation of the peracetic acid mixture and/or water reduced from hydrogen peroxide by addition of oxygen to acetic acid.

When acetic acid and hydrogen peroxide are mixed with a certain ratio as described above, peracetic acid is produced naturally. However, a considerable amount of time may occur until peracetic acid is produced to the desired (and/or maximum) concentration in the peracetic acid mixture.

Depending on cases, in the etching composition according to some example embodiments, the peracetic acid compound may additionally include an aging catalyst so as to increase and/or maximize a concentration of peracetic acid in the peracetic acid mixture in a short time. The aging catalyst may include, for example, at least one of sulfuric acid or methanesulfonic acid, but not limited hereto.

When the aging catalyst is used in the preparation of peracetic acid, acetic acid and the aging catalyst may be mixed in the peracetic acid mixture at a volume ratio of 33:0.1 (where, acetic acid is 33 and the aging catalyst is 0.1) to 33:10. In some example embodiments, acetic acid and the aging catalyst may be mixed in the peracetic acid mixture at a volume ratio of 33:1 to 33:2.

When sulfuric acid is used as the aging catalyst, the acetic aqueous solution of 100 percent concentration may be used as acetic acid in the preparation of peracetic acid, the hydrogen peroxide aqueous solution of 31 percent concentration may be used as hydrogen peroxide in the preparation of peracetic acid, and the sulfuric aqueous solution of 96 percent concentration may be used as sulfuric acid in the preparation of peracetic acid.

Meanwhile, when acetic acid, hydrogen peroxide, and sulfuric acid of different percent concentrations from those described above are used in the preparation of peracetic acid, volume ratios of acetic acid and the aging catalyst may change according to a percent concentration of acetic acid, a percent concentration of hydrogen peroxide and/or a percent concentration of the aging catalyst.

When content of the aging catalyst is in the range described above, the peracetic acid mixture including a desired (and/or maximum) concentration of peracetic acid may be prepared in about 24 hours. When content of the aging catalyst is low, time of preparing the peracetic acid mixture including a desired (and/or maximum) concentration of peracetic acid may increase. When content of the aging catalyst is high, heating problem may occur, in which temperature of the etching composition including the peracetic acid mixture increases.

When the aging catalyst is used, the peracetic acid mixture may include peracetic acid, acetic acid, hydrogen peroxide, and the aging catalyst.

The etching composition may include 15 wt % to 75 wt % of the peracetic acid mixture with respect to a total weight of the etching composition.

When content of the peracetic acid mixture is less than 15 wt %, oxidization of the silicon-germanium film may not occur sufficiently. As a result, etch rate of the silicon-germanium film may be decreased.

When content of the peracetic acid mixture exceeds 75 wt %, contents of the other materials included in the etching composition may be decreased, and accordingly, etch rate of the silicon-germanium film may be decreased. For example, the content of an etch material such as the fluorine compound may be reduced such that etch rate of the silicon-germanium film may be decreased.

The etching composition includes the fluorine compound. The fluorine compound may etch $SiO_2$ and $GeO_2$ oxidized with peracetic acid.

$SiO_2$ and $GeO_2$ oxidized with peracetic acid may be changed with the fluorine compound into water-soluble by-product forms such as $H_2SiF_6$ or $(NH_4)_2SiF_6$, $H_2GeF_6$ or $(NH_4)_2GeF_6$. As the by-products are dissolved in water, the silicon-germanium film may be etched.

The fluorine compound may be a compound that releases ion such as F—, HF, HF2-, etc. into the etching composition. Among the ions of the etching composition released from the fluorine compound, HF2- may mainly etch $SiO_2$ and $GeO_2$.

The fluorine compound may include, for example, at least one selected of (or from a group consisting of) HF, NaF, KF, $AlF_2$, $LiF_4$, $CaF_3$, $NaHF_6$, $NH_4F$, $NH_4HF_2$, $(CH_3)_4NF$, $KHF_2$, $HBF_4$, $NH_4BF_4$, $KBF_4$ and $H_2SiF_6$.

The etching composition including the fluorine compound with peracetic acid may have high etch rate with respect to the silicon-germanium film.

The etching composition may include 0.01 wt % to 5 wt % of the fluorine compound with respect to a total weight of the etching composition.

When content of the fluorine compound is less than 0.01 wt %, SiO2 and GeO2 oxidized with peracetic acid may not be removed sufficiently. As a result, etch rate of the silicon-germanium film may be decreased.

When content of the fluorine compound exceeds 5 wt %, an etch rate of the silicon-germanium film may increase, but etch rate of the silicon oxide film may also increase. The silicon film may be exposed if the silicon oxide film and the silicon-germanium film are excessively etched.

The etching composition includes the organic solvent. The organic solvent may act to increase etch selectivity of the etching composition.

The etching composition including the organic solvent can facilitate adjustment of the oxidizing power of peracetic acid with respect to a material to be oxidized, and the etch rate of the fluorine ions with respect to oxide. As a result, etch selectivity of the silicon-germanium film with respect to the silicon oxide film ($SiO_2$) and the silicon film can be enhanced.

The organic solvent may include, for example, at least one selected of (or from a group consisting of) methanol, ethanol, isopropanol, acetate, propionic acid, lactic acid, methylacetate, ethylacetate, sodium acetate, isopropyl acetate, n-propyl acetate, butyl acetate, n-butyl acetate, isobutyl acetate, vinyl acetate, pentyl acetate, octyl acetate, amyl acetate, and 2-ethoxyethyl acetate.

The etching composition may include 15 wt % to 65 wt % of the organic solvent with respect to a total weight of the etching composition.

When content of the organic solvent is less than 15 wt %, etch selectivity of the silicon-germanium film and the silicon film may be decreased. When content of the organic solvent is greater than 65 wt %, content of peracetic acid in the etching composition may be decreased, and accordingly, etch rate of the silicon-germanium film may be decreased.

The etching composition may additionally include a separate water (hereinbelow, "water in second state") other than the water (in first state) included in the peracetic acid mixture. The water (in second state) included in the etching composition may be a solvent included in the fluorine compound and/or the organic solvent which are mixed for preparation of the etching composition. Further, the etching composition may include water (e.g., deionized water (hereinbelow, "water in third state")) added to the etching composition to prepare 100 wt % etching composition.

However, the waters in first to third states may not represent the waters having different physical and/or chemical properties. That is, the waters in first to third states are used merely to describe the origins of the waters included in the etching composition.

The etching composition may include 0 wt % to 69 wt % of the waters (in second and third states) with respect to a total weight of the etching composition.

The etching composition according to the present disclosure may include the peracetic acid mixture, the fluorine compound, and the organic solvent, and the remainder being water (in second and third states).

Depending on cases, the etching composition according to some example embodiments of present disclosure may additionally include a silicon compound. The silicon compound may act to increase etch selectivity of the silicon-germanium film with respect to the silicon oxide film.

The silicon compound may include at least one selected of (or from a group consisting of) an alkoxy silane compound, a silanol compound, an oxime silane compound, a disilazane compound, and a disiloxane compound.

For example, the alkoxy silane compound may be selected of (or from a group consisting of) tert-butylmethoxydimethylsilane, 3-cyanopropyl dimethyl methoxysilane, ethoxy(trimethyl) silane, methoxytrimethylsilane, hexyl(dimethoxy)silane, methyldiethoxysilane, triethoxysilane, 3-aminopropyltriethoxysilane, 4-aminobutyldimethylmethoxysilane, 3-aminopropyldimethylethoxysilane and 3-(2-aminoethylamino)propyltrimethoxy silane.

The silanol compound may be selected of (or from a group consisting of) trimethylsilanol, dimethylsilandiol, diphenylsilanediol, silanetriol, 3-aminopropylsilanetriol, 1-methylsilanetriol, 2-methyl-2-propylsilanetrial, methyltriacetatesilanetriol, 2-(chloroethyl)triacetate silanetriol and 3-(hydroxypropyl) silanetriol.

The oxim silane compound may be selected of (or from a group consisting of) di(ethylketoxime)silane, mono(ethylketoxime)silane, tris(ethylketoxime)silane, tetra(ethylketoxime)silane, methyltris(methylethylketoxime)silane, methyltris(acetoxme)silane, methyltris(methylisobutylketoxime) silane, dimethyldi(methylethylketoxime) silane, trimethyl (methylethylketoxime) silane, tetra(methylethylketoxime) silane, tetra(methylisobutylketoxime)silane, vinyltris (methylethylketoxime)silane, methylvinyldi(methylethylketoxime)silane, vinyltris(methylethylketoxime)silane, methylvinyldi(methylethylketoxime)silane, methylvinyldi (cyclohexanoneoxime)silane, vinyltris(methylisobutylketoxime)silane) and phenyltris(methylethylketoxime) silane.

The disilazane compound and the disiloxane compound may be selected of (or from a group consisting of) hexamethyldisilazane, hexamethyldisiloxane, octamethylcyclotetrasiloxane, decamethylcyclopentasiloxane and dodecamethylcyclohexasiloxane.

However, the silicon compounds above described are merely example, and example embodiments are not limited thereto.

When the etching composition includes the silicon compound, the etching composition may include 0.01 wt % to 5 wt % of the silicon compound with respect to a total weight of the etching composition.

When content of the silicon compound is less than 0.01 wt %, etch selectivity of the silicon-germanium film and the silicon oxide film may be decreased. When content of the silicon compound is greater than 5 wt %, a phenomenon may occur, in which etch rate of the silicon-germanium film, etch rate of the silicon film and etch rate of the silicon oxide film are decreased.

Depending on cases, the etching composition according to some example embodiments of present disclosure may additionally include separate acetic acid or hydrogen peroxide other than acetic acid and hydrogen peroxide that are fed for the preparation of the peracetic acid aqueous solution.

Depending on cases, the etching composition according to some example embodiment of present disclosure may additionally include a surfactant, a metal ion blocker, a corrosion inhibitor, and so on.

Because the etching composition of the present disclosure including peracetic acid, the fluorine compound, and the organic solvent may have high etch selectivity of the silicon-germanium film with respect to the silicon film, it can etch the silicon-germanium film from the stack structure including the silicon film and the silicon-germanium film, while reducing etching amount of the silicon film.

When the etching composition of the present disclosure is used to etch the silicon-germanium film, etch rate of the silicon-germanium film with respect to the the silicon film is high, and the etch selectivity of the silicon-germanium film with respect to the silicon film is also increased.

Further, as the silicon-germanium film may be selectively and rapidly removed, damage of the oxide membrane exposed to the etching composition or deterioration of the electrical characteristics due to etching of the oxide film may be prevented. As a result, the semiconductor device may have enhanced device characteristics.

When the wet etching is performed by using the etching composition according to some example embodiments, the wet etching temperature may be 10° C. to 80° C., and/or, 15° C. to 50° C., but not limited hereto.

Proper temperature for the etch process may be determined by considering other process factors, and so on.

Following will describe the etching composition according to some example embodiments by using Experimental Examples. However, following Experimental Examples are provided only for convenience of explanation, and the present disclosure is not limited hereto.

In the following Experimental Examples, composition of the etching composition is expressed with wt % in order to more clearly represent relative amounts. Accordingly, a person skilled in the art who is well informed of the present disclosure may be able to repeatedly perform tests by properly adjusting the scale in the wt % amounts suggested below.

Table 1 represents composition of the etching composition included in the Experimental Examples. The Experimental Examples A to H represent the etching composition according to some example embodiments, and the Experimental Examples I to K are comparative Examples. Composition of the etching composition is represented with wt % of each component with respect to a total weight of the etching composition.

TABLE 1

|  | A | B | C | D | E | F | G | H | I | J | K |
|---|---|---|---|---|---|---|---|---|---|---|---|
| peracetic acid mixture | 40 | 40 | 60 | 40 | 40 | 40 | 40 | 40 |  | 40 | 40 |
| nitric acid |  |  |  |  |  |  |  |  | 30 |  |  |
| fluorine compound A | 0.3 | 0.3 | 0.7 | 0.3 | 0.3 | 0.3 | 0.3 | 0.3 | 0.3 | 0.3 | 0.3 |
| fluorine compound B |  |  |  |  |  | 0.5 | 0.5 |  |  |  |  |
| silicon compound A |  | 0.1 | 0.4 |  |  |  |  |  |  |  |  |
| silicon compound B |  |  |  | 0.1 |  |  |  |  |  |  |  |
| silicon compound C |  |  |  |  | 0.2 |  |  |  |  |  |  |
| silicon compound D |  |  |  |  |  |  |  | 1 |  |  |  |
| ammonium acetate |  |  |  |  |  |  |  |  |  |  | 2 |
| propyl acetate | 35 | 35 | 35 | 35 | 35 | 35 |  | 35 |  |  |  |
| acetic acid |  |  |  |  |  | 10 | 50 |  | 30 |  |  |
| DIW | 24.7 | 24.6 | 3.9 | 24.6 | 24.5 | 14.2 | 9.2 | 23.7 | 39.7 | 59.7 | 57.7 |

In Table 1, the peracetic acid mixture is prepared by mixing the acetic acid aqueous solution of 100 percent concentration, the hydrogen peroxide aqueous solution of 31 percent concentration, and the sulfuric aqueous solution of 96 percent concentration, with a volume ratio of 33:26:1.

In Table 1, the fluorine compound A may be hydrofluoric acid and the fluorine compound B may be hexafluorosilicon. The silicon compound A may be 3-aminopropylsilanetriol which is one of the silanol compounds, and the silicon compound B may be 3-aminopropyltriethoxysilane which is one of the alkoxy silane compounds. The silicon compound C may be methyltris(methylethylketoxime)silane which is one of the oxime silane compounds, and silicon compound D may be hexamethyldisilazane which is one of the disilazane compounds.

In Table 1, acetic acid additionally included in the etching composition may be the acetic acid aqueous solution of 100 a percent concentration, and the deionized water (DIW) may be the water in second state and/or the water in third state among the waters in first to third states described above.

Using the etching composition prepared in the Experimental Examples A to K, etching evaluation was performed with respect to the silicon-germanium film, the polysilicon film, and the silicon oxide film.

A substrate with the silicon-germanium film, the polysilicon film, and the silicon oxide film formed thereon was immersed in the etching composition of the Experimental Examples A to K. The substrate with the silicon-germanium film, the polysilicon film, and the silicon oxide film formed thereon was immersed in the etching composition for 120 seconds.

With Ellipsometer (NANO VIEW, SEMG-1000) which is a thin film thickness measurement device, change of thickness of the silicon-germanium film, the polysilicon film and the silicon oxide film was measured. That is, film thickness of each of the silicon-germanium film, the polysilicon film and the silicon oxide film before and after the etching was measured. Using the measured thickness change and immersion time, the etch rate of the silicon-germanium film, the polysilicon film and the silicon oxide film were determined. Unit of the etch rate of each of the silicon-germanium film, the polysilicon film and the silicon oxide film is Å/min. The etch selectivity of the silicon film with respect to the silicon-germanium film was determined by dividing the etch rate of the silicon-germanium film by the etch rate of the silicon film. Further, the etch selectivity of the silicon oxide film with respect to the silicon-germanium film was determined by dividing the etch rate of the silicon-germanium film by the etch rate of the silicon oxide film.

For the evaluation of the etch rate of the silicon-germanium film, the polysilicon film and the silicon oxide film, the evaluation temperature of the wet etching with the etching composition may be in ° C. unit.

Table 2 represents the etch rate of the silicon-germanium film and the polysilicon film, and the etch selectivity of the silicon-germanium film with respect to the polysilicon film.

TABLE 2

|   | Temperature | Etch Rate | | Selectivity |
|---|---|---|---|---|
|   |   | SiGe | Si | SiGe/Si |
| A | 25 | 170.8 | 3.8 | 44.9 |
| B | 25 | 152.3 | 3.4 | 44.8 |
| C | 25 | 204.6 | 3.3 | 61.5 |
| D | 25 | 150.5 | 3.6 | 41.8 |
| E | 25 | 148.4 | 3.4 | 43.6 |
| F | 25 | 190 | 3.9 | 48.7 |
| G | 25 | 206.1 | 6 | 34.4 |
| H | 25 | 225.7 | 5.1 | 44.3 |
| I | 25 | 129 | 14.8 | 8.7 |
| J | 25 | 156.1 | 8.8 | 17.7 |
| K | 25 | 210.5 | 13.6 | 15.5 |

Referring to Table 2, compared with the comparative Examples I and J using the etching composition excluding the organic solvent, the Experimental Examples A to F and H of the present disclosure using the etching composition including the organic solvent exhibited the low etch rate of the polysilicon film and the enhanced etch rate of the silicon-germanium.

Table 3 represents the etch rate of the silicon-germanium film and the silicon oxide film, and the etch selectivity of the silicon-germanium film with respect to the silicon oxide film.

TABLE 3

|   | Temperature | Etch Rate | | Selectivity |
|---|---|---|---|---|
|   |   | SiGe | SiO2 | SiGe/SiO2 |
| B | 25 | 152.3 | 2.2 | 69.2 |
| C | 25 | 204.6 | 4.3 | 47.2 |
| D | 25 | 150.5 | 2.5 | 60.2 |
| E | 25 | 148.4 | 2.8 | 53 |
| F | 25 | 190 | 4.1 | 46.3 |
| G | 25 | 206.1 | 4.1 | 50.3 |
| H | 25 | 225.7 | 5.7 | 39.6 |
| I | 25 | 129 | 23.4 | 5.5 |
| J | 25 | 156.1 | 7.4 | 21.1 |
| K | 25 | 210.5 | 25.8 | 8.1 |

Referring to Table 3, compared with the comparative Examples I to K excluding the silicon compound, the Experimental Examples B to H of the present disclosure using the etching composition including the silicon compound exhibited the etch rate of the silicon oxide film controlled to be low. As a result, the Experimental Examples B to H of the present disclosure show that the etch selectivity of the silicon-germanium film with respect to the silicon oxide film is kept high.

Figure 12:
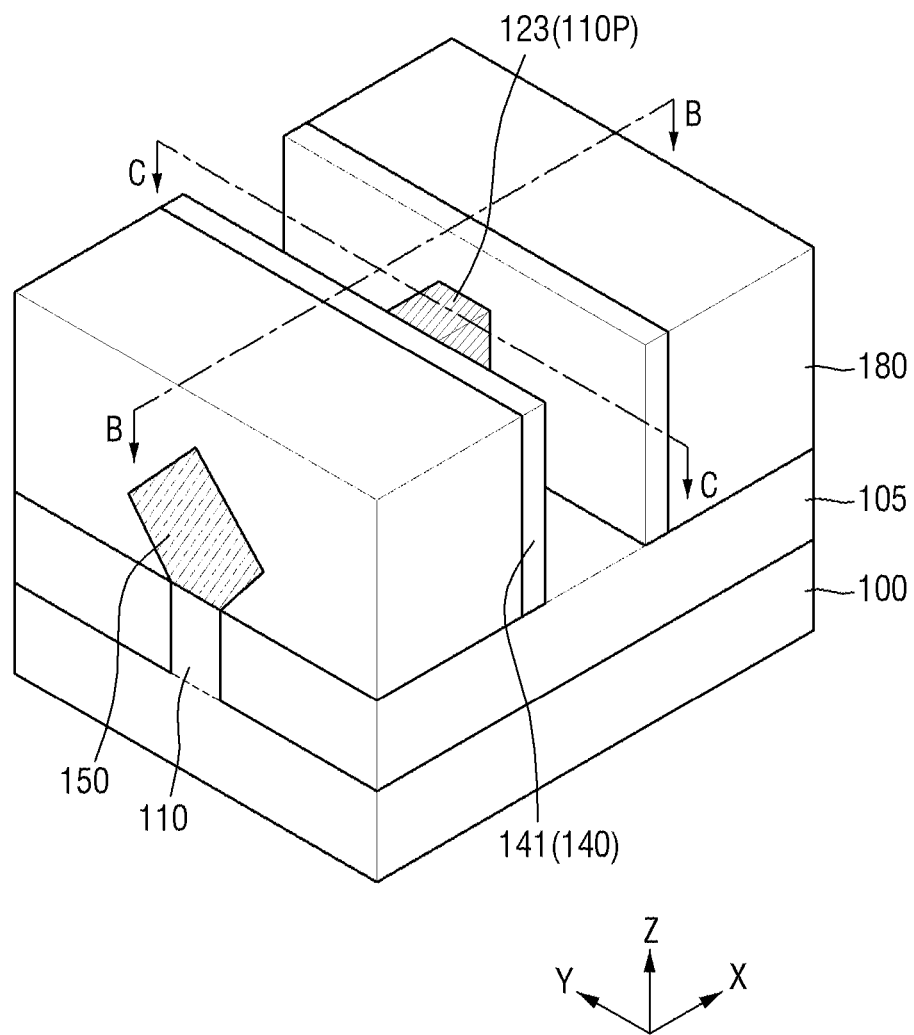
Figure 13:
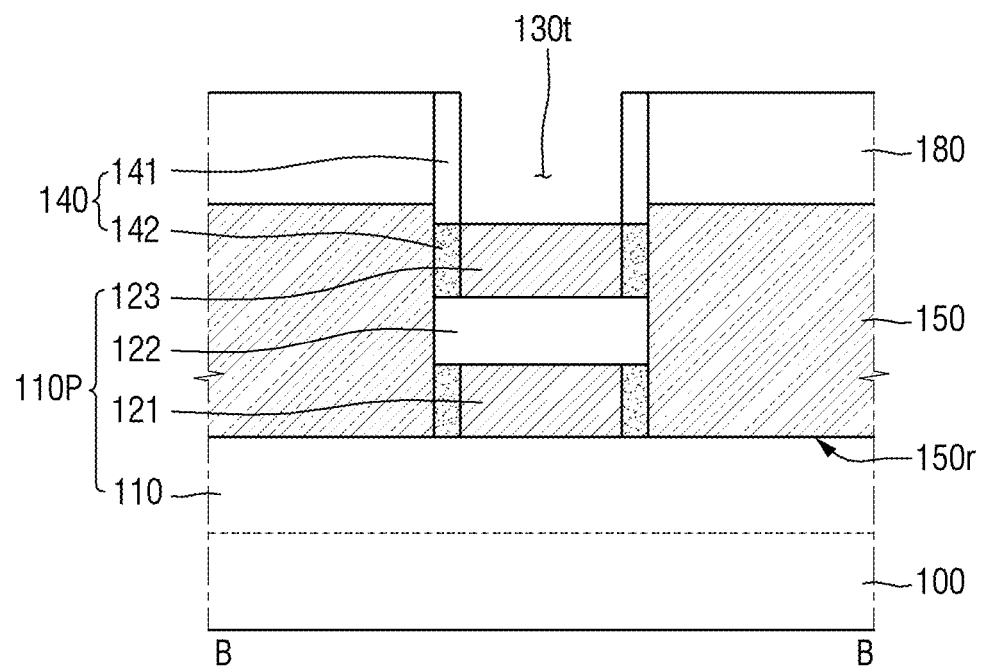
Figure 14:
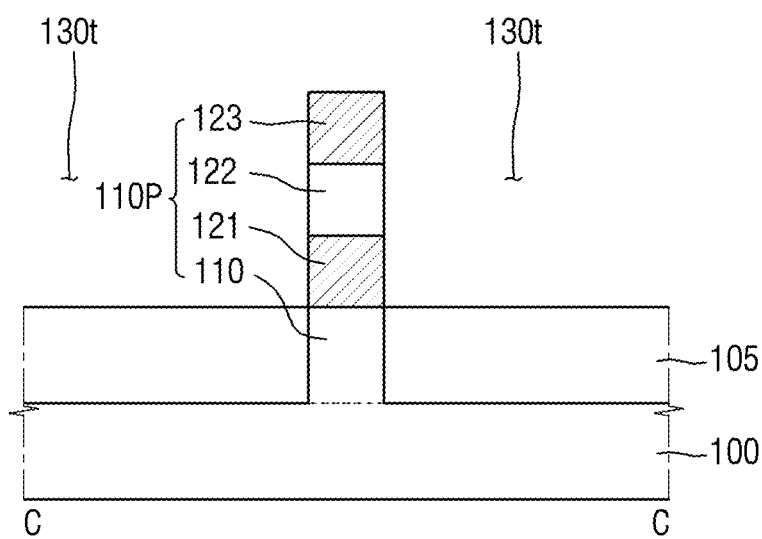

FIGS. 1 to 18 are views illustrating intermediate stages of fabrication, provided to explain a method for fabricating a semiconductor device by using an etching composition according to some example embodiments of present disclosure. FIG. 7 is a cross sectional view taken on line A-A of FIG. 6. FIG. 9 is a cross sectional view taken on line A-A of FIG. 8. FIG. 13 is a cross sectional view taken on line B-B of FIG. 12, and FIG. 14 is a cross sectional view taken on line C-C of FIG. 12.

Referring to FIG. 1, a first sacrificial film 2001, an active film 2002, and a second sacrificial film 2003 are formed sequentially on the substrate 100. The sacrificial film 2001, the active film 2002, and the second sacrificial film 2003 may be formed by using, for example, an epitaxial growth method.

The substrate 100 may be a bulk silicon or a silicon-on-insulator SOI. Alternatively, the substrate 100 may be a silicon substrate, or may include another material such as silicon germanium, silicon germanium on insulator (SGOI), indium antimonide, lead telluride, indium arsenide, indium phosphide, gallium arsenide, or gallium antimonide, but not limited hereto.

The first sacrificial film 2001 and the second sacrificial film 2003 may include the same material, and the first sacrificial film 2001 and the active film 2002 may include different materials. In explaining a method for fabricating a semiconductor device according to some example embodiments, it is assumed that the first sacrificial film 2001 and the second sacrificial film 2003 include the same material.

Further, the active film 2002 may include a material with etch selectivity with respect to the first sacrificial film 2001 and the second sacrificial film 2003. In the method for fabricating the semiconductor device according to some example embodiments, the active film 2002 may include silicon, and the first sacrificial film 2001 and the second sacrificial film 2003 may each include silicon-germanium.

In FIG. 1, it is illustrated that the active film 2002 is a single-layered film and the sacrificial films 2001, 2003 are two-layered films, but this is only for convenience of explanation, and may not be limited hereto.

Further, although it is illustrated that the second sacrificial film 2003 is positioned on an uppermost portion, example embodiments are not limited hereto. Accordingly, it is of course possible that the active film may be additionally formed on the second sacrificial film 2003 to be positioned on the uppermost portion of a stack film structure.

Then, a first mask pattern 2103 may be formed on the second sacrificial film 2003. The first mask pattern 2103 may be elongated in a first direction X.

For example, the first mask pattern 2103 may include, for example, at least one of a silicon oxide film, a silicon nitride film, and a silicon oxynitride film, but not limited hereto.

Figure 2:
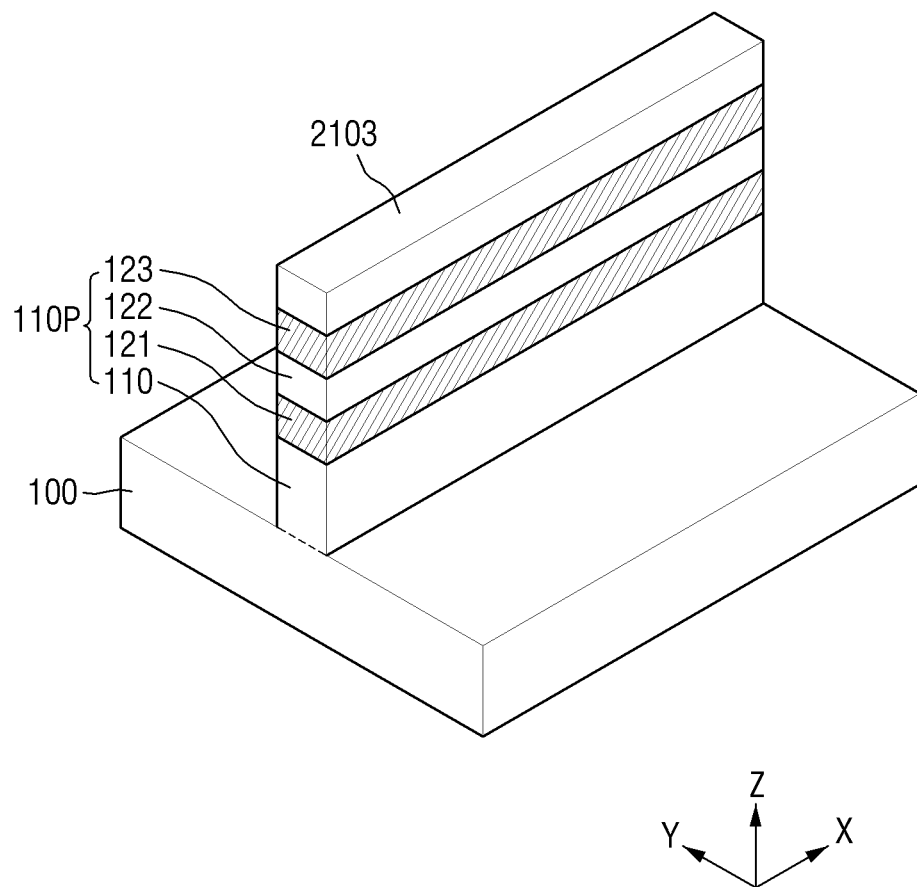

Referring to FIG. 2, the etch process is conducted by using the first mask pattern 2103 as a mask, to thus form a fin-type structure 110P.

The fin-type structure 110P may be formed by patterning a portion of the second sacrificial film 2003, the active film 2002, the first sacrificial film 2001, and the substrate 100.

The fin-type structure 110P may be formed on the substrate 100 and protruded from the substrate 100. Likewise the first mask pattern 2103, the fin-type structure 110P may be extended in the first direction X.

In the fin-type structure 110P, a fin-type pattern 110, a first sacrificial pattern 121, a pre-wire pattern 122, and a second sacrificial pattern 123 are stacked sequentially on the substrate 100.

In a method for fabricating a semiconductor device according to some example embodiments, the first and second sacrificial patterns 121, 123 may be silicon-germanium patterns, and the pre-wire pattern 122 may be a silicon pattern.

That is, the fin-type structure 110P may include a silicon pattern and a silicon-germanium pattern which are alternately stacked.

Figure 3:
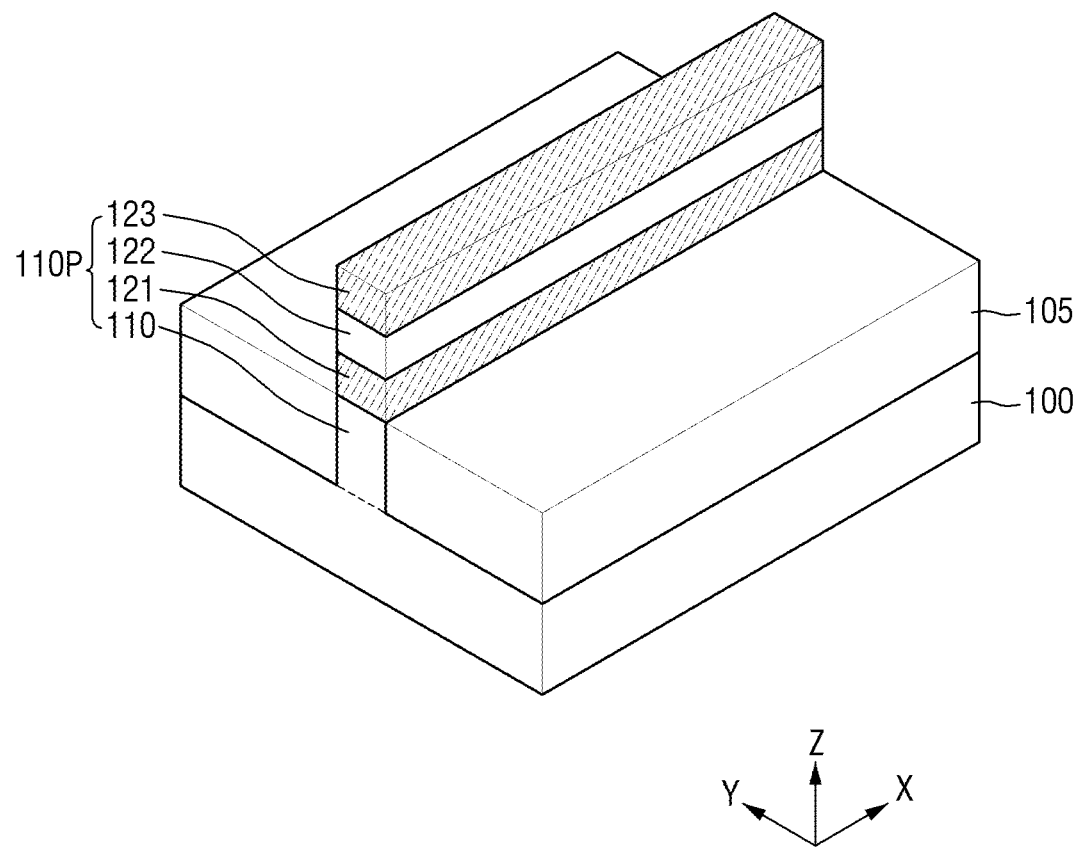

Referring to FIG. 3, a field insulating film 105 overlying at least a portion of a sidewall of the fin-type structure 110P may be formed on the substrate 100.

For example, the field insulating film 105 overlying the fin-type structure 110P is formed on the substrate 100. With the planarization process of the field insulating film 105, an upper surface of the fin-type structure 110P and an upper surface of the field insulating film 105 may be flush with each other.

The first mask pattern 2103 may be removed in the planarization process, but not limited hereto.

The upper portion of the field insulating film 105 is then recessed, thus exposing a portion of the fin-type structure 110P. The recess process may include a selective etch process. That is, the fin-type structure 110P protruded on the field insulating film 105 may be formed.

As illustrated in FIG. 3, the second sacrificial pattern 123, the pre-wire pattern 122 and the first sacrificial pattern 121 may be protruded on the upper surface of the field insulating film 105, and a sidewall of the fin-type pattern 110 may be entirely surrounded by the field insulating film 105, but not limited hereto.

That is, a portion of the sidewall of the fin-type pattern 110 may be protruded above the upper surface of the field insulating film 105 through the recess process on the upper portion of the field insulating film 105. Alternatively, a portion of a sidewall of the first sacrificial pattern 121 may be overlain with the field insulating film 105.

The pre-wire pattern 122 may be doped for the purpose of threshold voltage adjustment, before and/or after the recess process which causes the portion of the fin-type structure 110P to protrude upward higher than the upper surface of the field insulating film 105.

Figure 4:
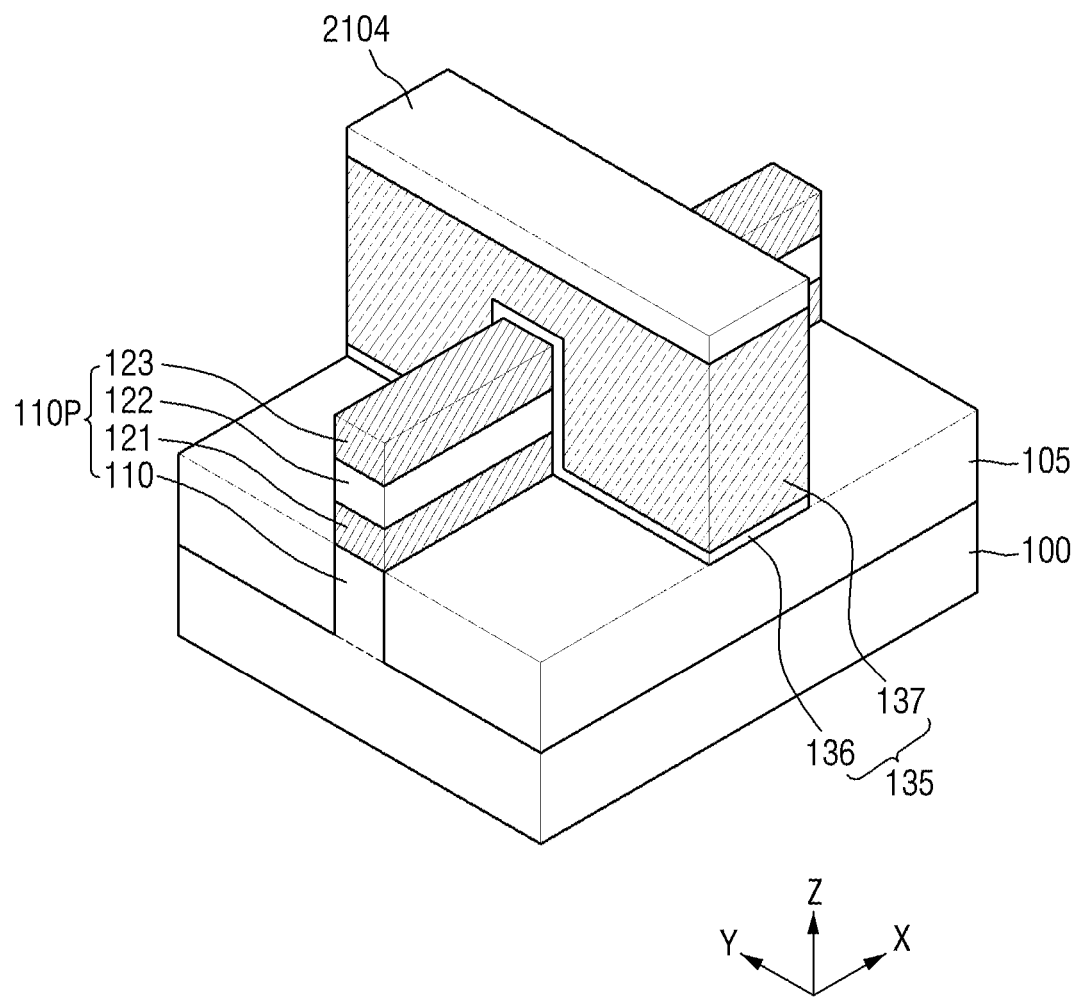

Referring to FIG. 4, a dummy gate pattern 135 intersecting the fin-type structure 110P and extending in the second direction Y may be formed by performing the etch process with a second mask pattern 2104. The dummy gate pattern 135 may be formed on the fin-type structure 110P.

The dummy gate pattern 135 may include a dummy gate insulating film 136 and a dummy gate electrode 137. For example, the dummy gate insulating film 136 may include the silicon oxide film, and the dummy gate electrode 137 may include polysilicon or amorphous silicon.

Figure 5:
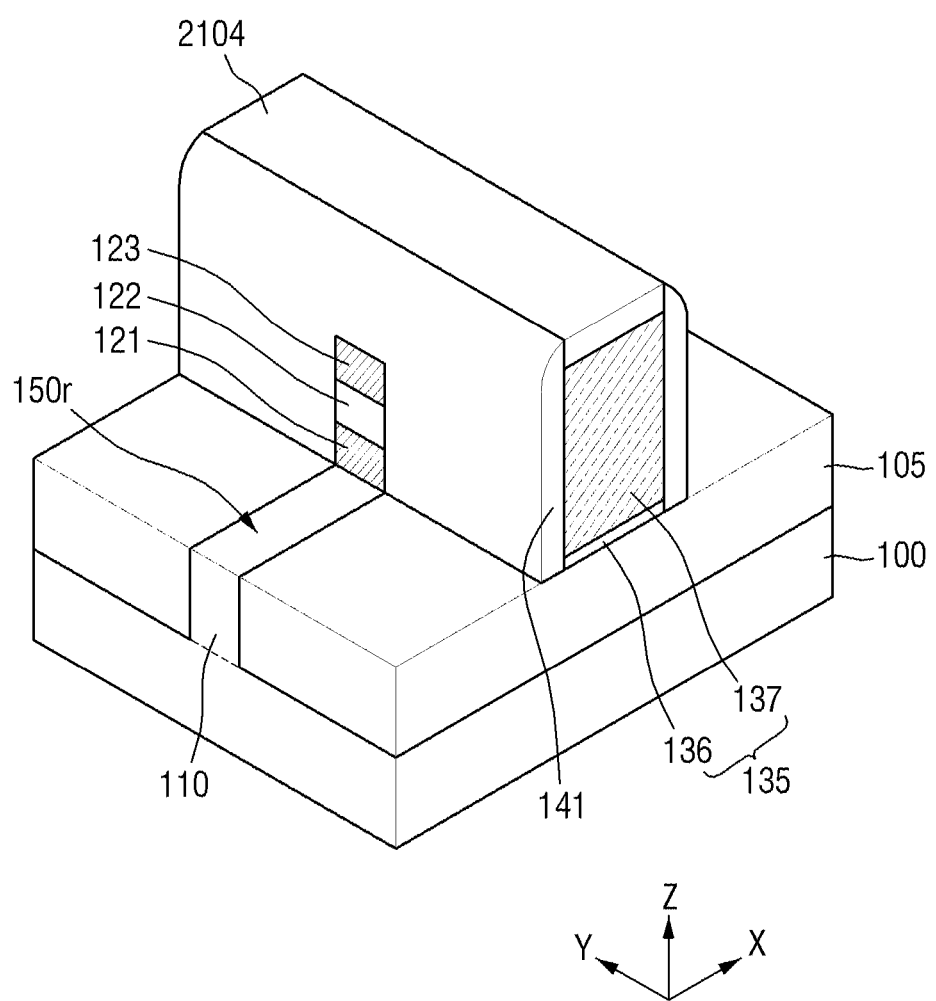

Referring to FIG. 5, an outer spacer 141 may be formed on a sidewall of the dummy gate pattern 135. That is, the outer spacer 141 may be formed on sidewalls of the dummy gate insulating film 136 and the dummy gate electrode 137.

For example, a first spacer film overlying the dummy gate pattern 135 and the fin-type structure 110P is formed on the field insulating film 105. The first spacer film may then be etched-back, thus leaving the outer spacer 141 on a sidewall of the dummy gate pattern 135.

For example, the outer spacer 141 may include at least one of silicon nitride (SiN), silicon oxynitride (SiON), silicon oxide (SiO2), silicon oxycarbonitride (SiOCN), and a combination thereof, but not limited hereto.

Additionally, a portion of the fin-type structure 110P non-overlapped with the dummy gate electrode 137 and the outer spacer 141 may be partially removed, using the dummy gate pattern 135 including the dummy gate electrode 137 as a mask. As a result, a recess 150r may be formed in the fin-type structure 110P.

FIG. 5 illustrates that a bottom surface of the recess 150r is the fin-type pattern 110, but this is only for convenience of explanation, and example embodiments are not limited hereto.

Forming the outer spacer 141 and forming the recess 150r may be concurrently performed, although example embodiments are not limited hereto. That is, the recess 150r may be formed by removing a portion of the fin-type structure 110P, after the outer spacer 141 is formed.

While the recess 150r is formed in the fin-type structure 110P, the first sacrificial pattern 121 and the second sacrificial pattern 123, which are not overlapped with the dummy gate electrode 137 and the outer spacer 141, may be removed.

Further, while the recess 150r is formed in the fin-type structure 110P, the pre-wire pattern 122, which is not overlapped with the dummy gate electrode 137 and the outer spacer 141, may be removed.

Due to the presence of the recess 150r, a cross section of the first sacrificial pattern 121, a cross section of the second sacrificial pattern 123, and a cross section of the pre-wire pattern 122 may be exposed.

Figure 6:
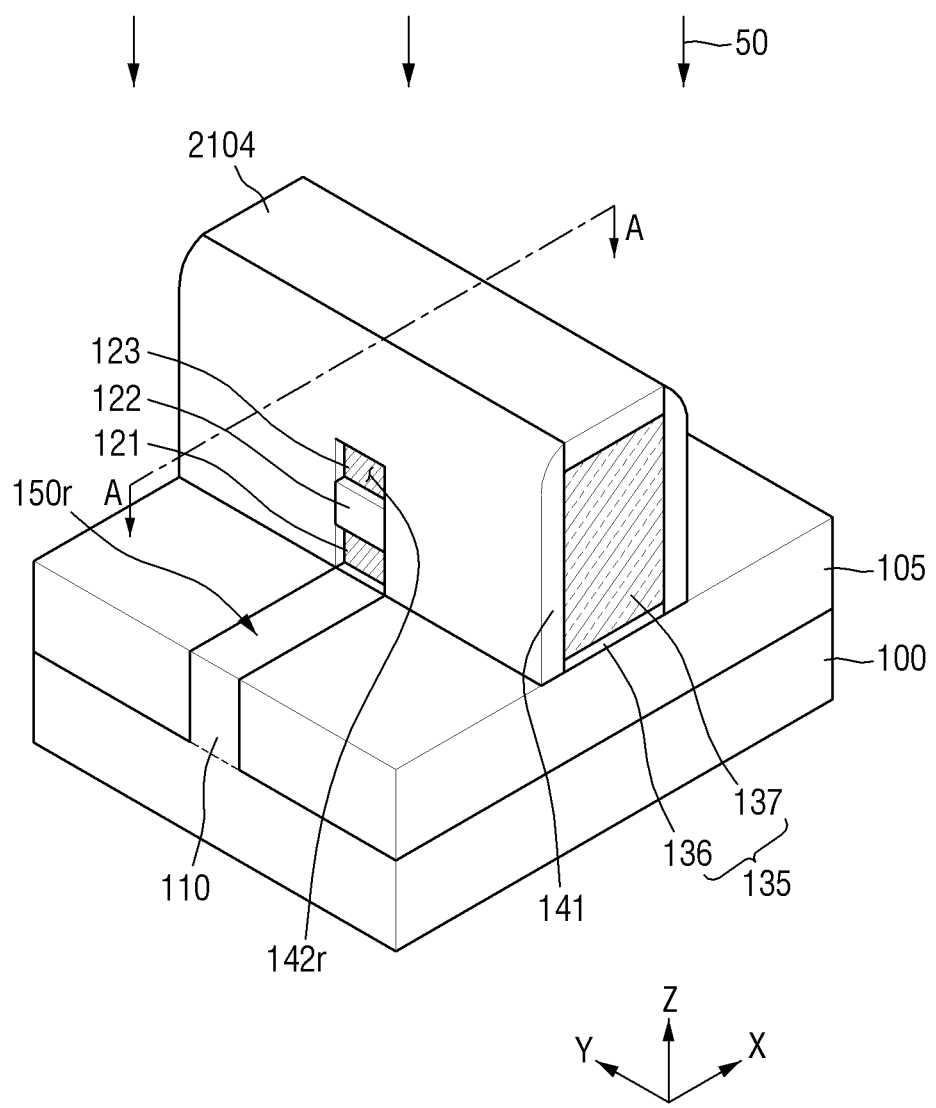
Figure 7:
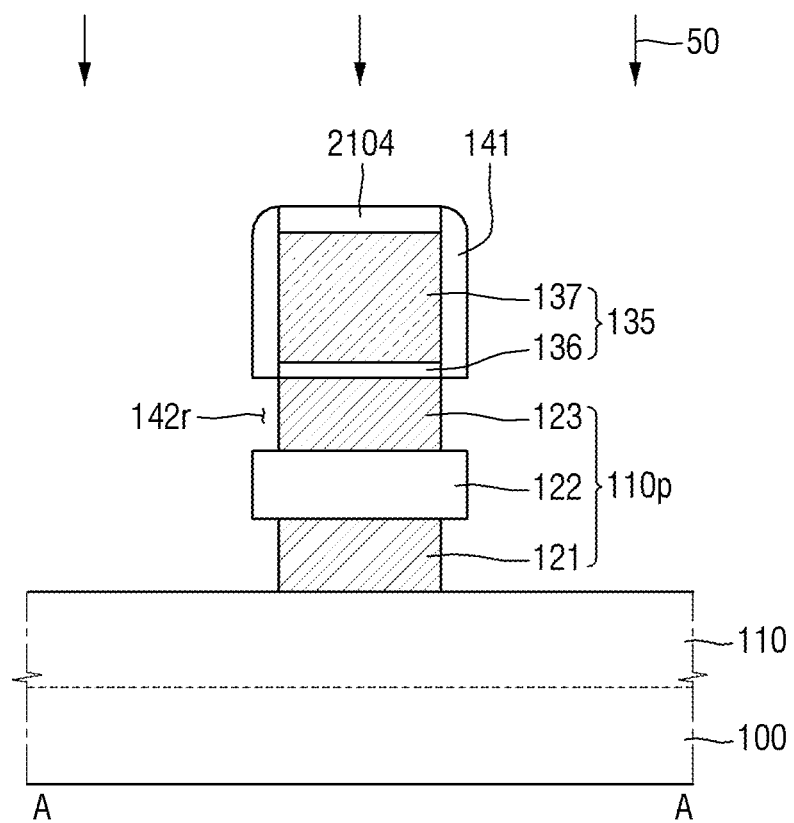

Referring to FIGS. 6 and 7, at least a portion of the first sacrificial pattern 121 and at least a portion of the second sacrificial pattern 123, which are exposed by the recess 150r and overlapped with the outer spacer 141, may be removed in wet etching 50.

As a result, a dimple 142r may be formed between the outer spacer 141 and the pre-wire pattern 122.

The dimple 142r may be in a shape that is depressed in the first direction X toward the dummy gate electrode 137 farther than the cross section of the pre-wire pattern 122 exposed by the recess 150r.

In other words, a width of the pre-wire pattern 122 in the first direction X may be greater than widths of the first and second sacrificial patterns 121, 123 in the first direction X.

The wet etching 50 may be conducted by using the etching composition described above according to some example embodiments of present disclosure.

Figure 8:
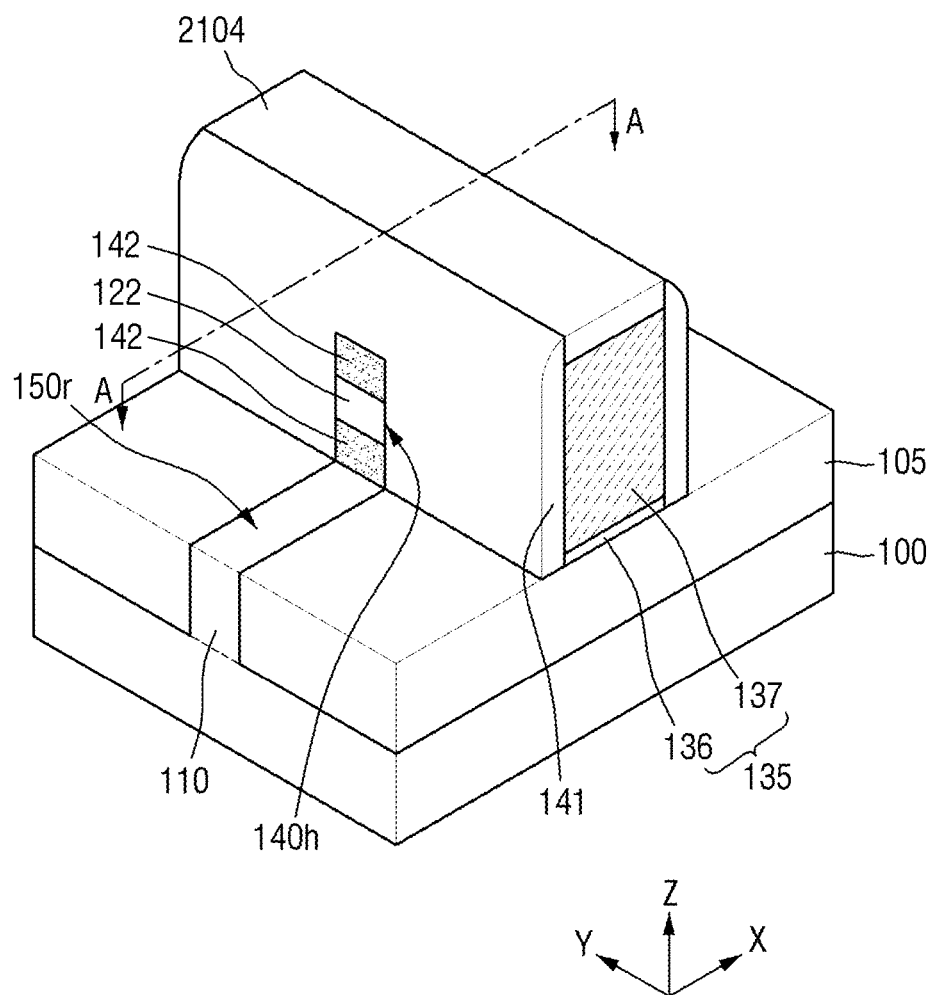
Figure 9:
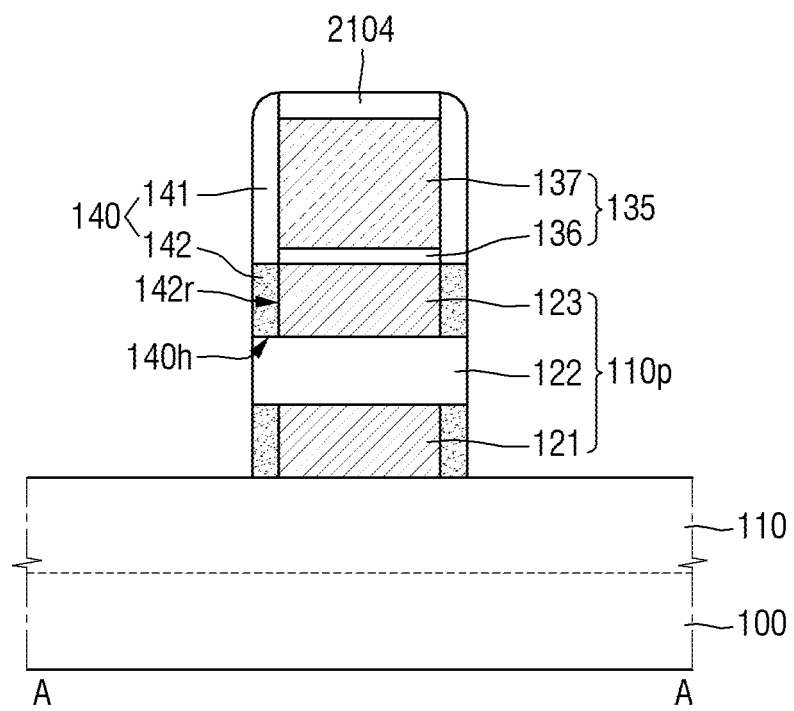

Referring to FIGS. 8 and 9, an inner spacer 142 may be formed by filling the dimple 142r with an insulating material.

For example, a second spacer film for filling the dimple 142r may be formed. The second spacer film may be a material with a good gap-filling capability. The second spacer film may also be formed on the field insulating film 105, a sidewall of the outer spacer 141, and the dummy gate pattern 135.

The etch process may then be conducted, thus etching the second spacer film until an upper surface of the fin-type pattern 110, which is not overlapped with the dummy gate pattern 135 and the outer spacer 141, is exposed. As a result, the inner spacer 142 may be formed.

Accordingly, a gate spacer 140 including the outer spacer 141 and the inner spacer 142 may be formed.

Figure 17:
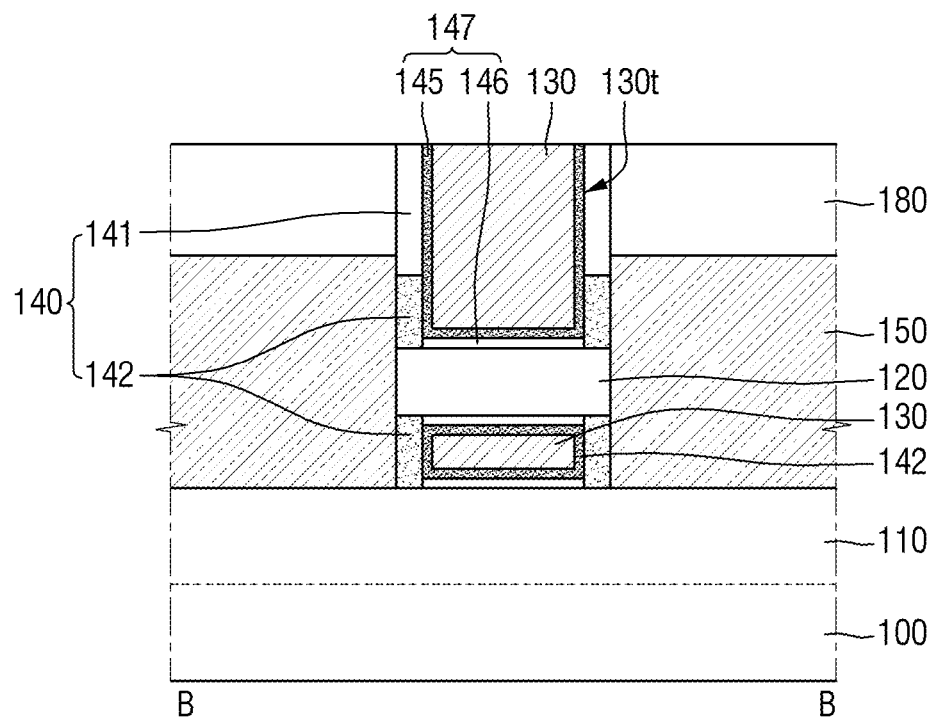

A first dielectric constant of a material included in the inner spacer 142 may be smaller than a second dielectric constant of a material included in the outer spacer 141 so as to reduce fringing capacitance between a gate electrode 130 of FIG. 17 and an epitaxial pattern 150 of FIG. 17, but not limited hereto.

Further, a through hole 140h, defined by the outer spacer 141 and the inner spacer 142, may be formed in the gate spacer 140. The pre-wire pattern 122 may be exposed through the through hole 140h. That is, the pre-wire pattern 122 may be passed through the through hole 140h.

For example, the inner spacer 142 may include at least one of a low-k dielectric material, silicon nitride (SiN), silicon oxynitride (SiON), silicon oxide (SiO2), silicon oxycarbidenitride (SiOCN), and a combination thereof, but not limited hereto. The low-k dielectric material may be a material that has a smaller dielectric constant than silicon oxide.

Figure 10:
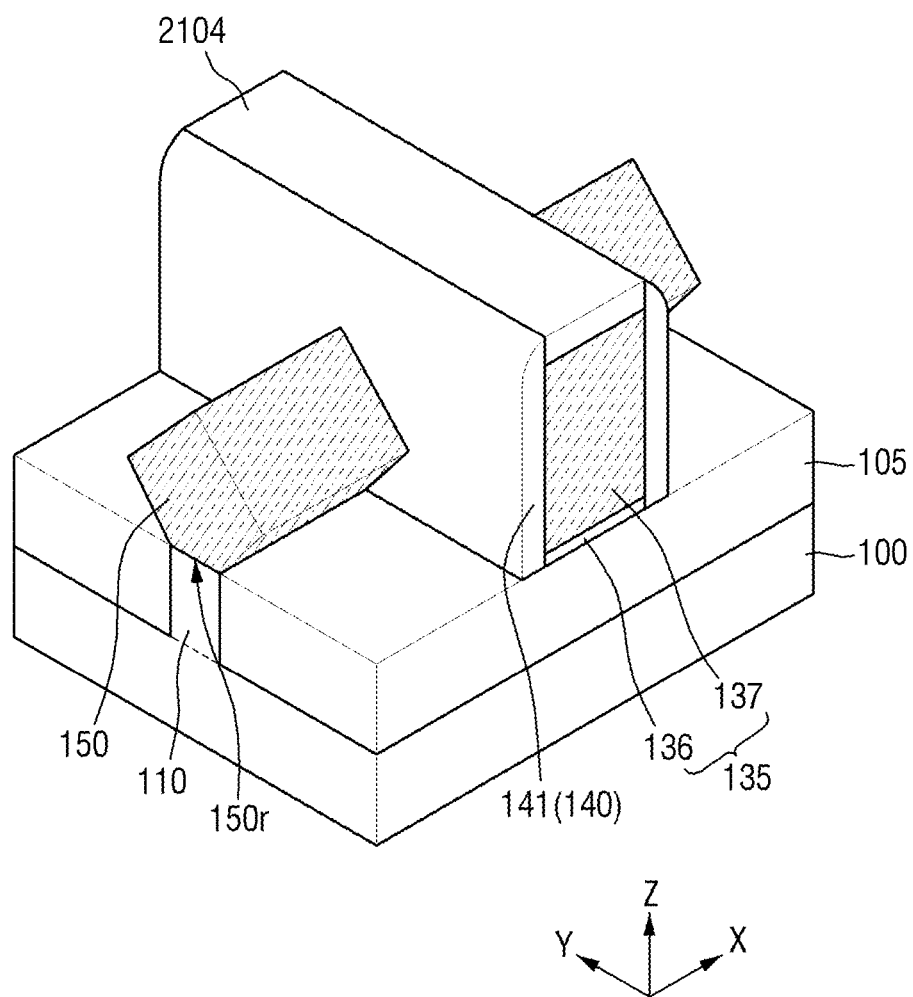

Referring to FIG. 10, the epitaxial pattern 150 for filling the recess 150r may be formed. The epitaxial pattern 150 may be formed on both sides of the dummy gate pattern 135.

The epitaxial pattern 150 may be included in a source/drain of a transistor which uses the pre-wire pattern 122 as a channel region.

The epitaxial pattern 150 may be formed with the exposed fin-type pattern 110 and the pre-wire pattern 122 as a seed layer, although embodiments are not limited hereto.

It is of course possible that the seed layer is additionally formed on a cross section of the pre-wire pattern 122 and the fin-type pattern 110, which are exposed by the recess 150r.

The epitaxial pattern 150 may be formed so as to overlie the inner spacer 142. The epitaxial pattern 150 may be in contact with the inner spacer 142. Further, the epitaxial pattern 150 may be in contact with the pre-wire pattern 122.

The epitaxial pattern 150 may be formed by using an epitaxial process. Depending on whether the transistor prepared with the method for fabricating the semiconductor device according to some example embodiments is an n-type transistor or a p-type transistor, a material of an epitaxial layer included in the epitaxial pattern 150 may vary. Further, depending on needs, impurity may be doped in situ during the epitaxial process.

Figure 11:
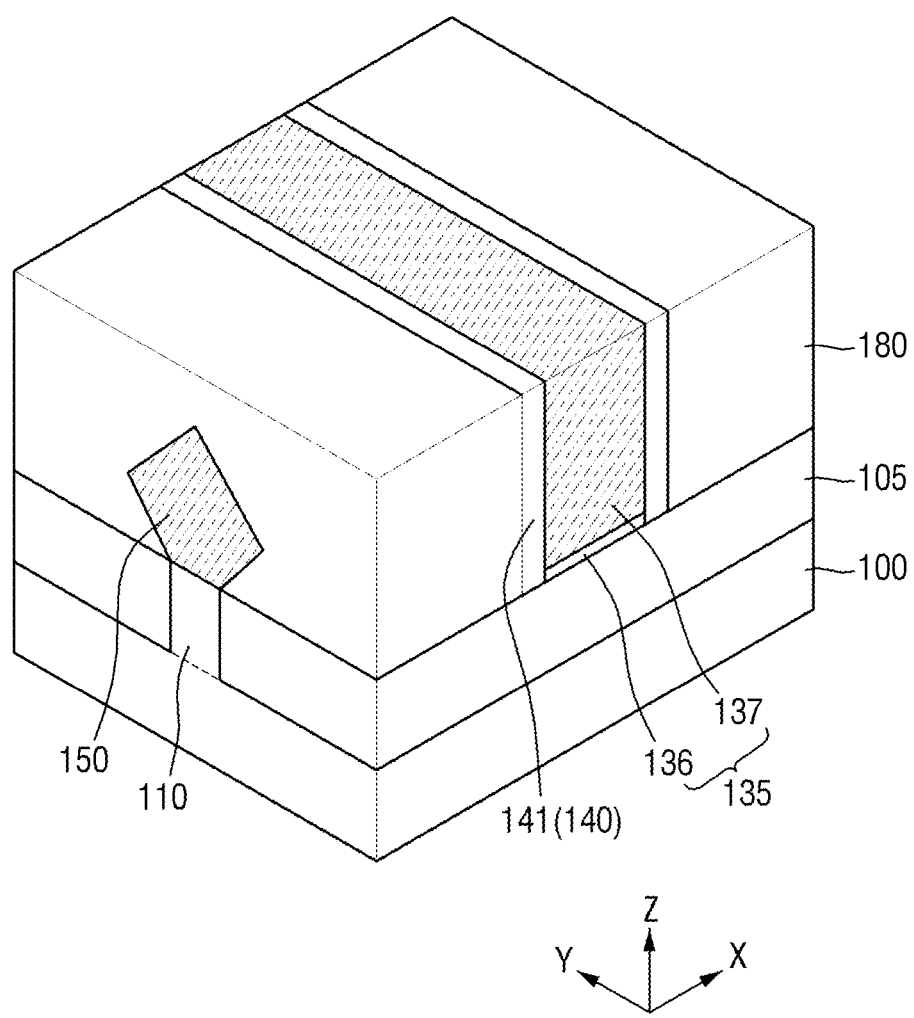

Referring to FIG. 11, an interlayer insulating film 180 overlying the epitaxial pattern 150, the gate spacer 140, the dummy gate pattern 135, and so on may be formed on the field insulating film 105.

For example, the interlayer insulating film 180 may include silicon oxide, silicon nitride, silicon oxynitride, flowable oxide (FOX), Tonen silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SILK, polyimide, porous polymeric material, or a combination thereof, but not limited hereto.

Next, the first interlayer insulating film 180 may be planarized until the upper surface of the dummy gate electrode 137 is exposed. As a result, the second mask pattern 2104 may be removed, thus exposing the upper surface of the dummy gate electrode 137. Further, the interlayer insulating film 180 may surround a sidewall of the outer spacer 141.

Referring to FIGS. 12 to 14, the dummy gate pattern 135, e.g., the dummy gate insulating film 136 and the dummy gate electrode 137 may be removed.

As a result, a gate trench 130t may be formed within the interlayer insulating film 180. The interlayer insulating film 180 may include the gate trench 130t.

As the dummy gate insulating film 136 and the dummy gate electrode 137 are removed, the fin-type structure 110P and the field insulating film 105 overlapped with the dummy gate pattern 135 may be exposed. Due to the presence of the gate trench 130t, the fin-type structure 110P overlapped with the dummy gate pattern 135 may be exposed.

That is, the first sacrificial pattern 121, the second sacrificial pattern 123 and the pre-wire pattern 122, which are overlapped with the dummy gate pattern 135, may now be exposed by the gate trench 130t.

Following description is based on a cross sectional view taken on lines B-B and C-C of FIG. 12.

Figure 15:
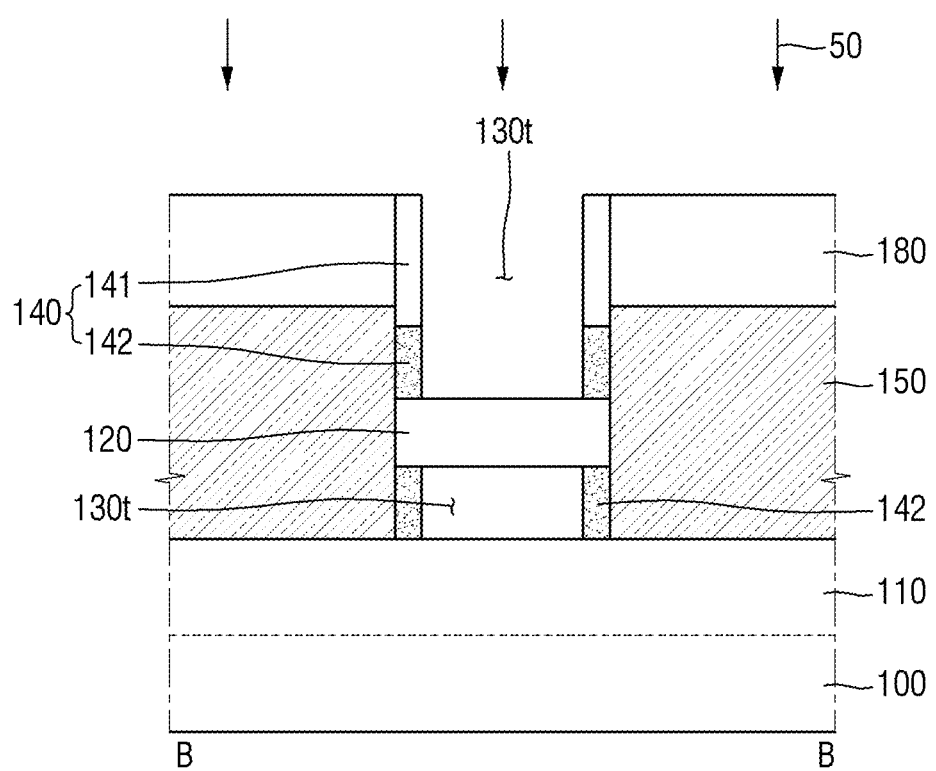
Figure 16:
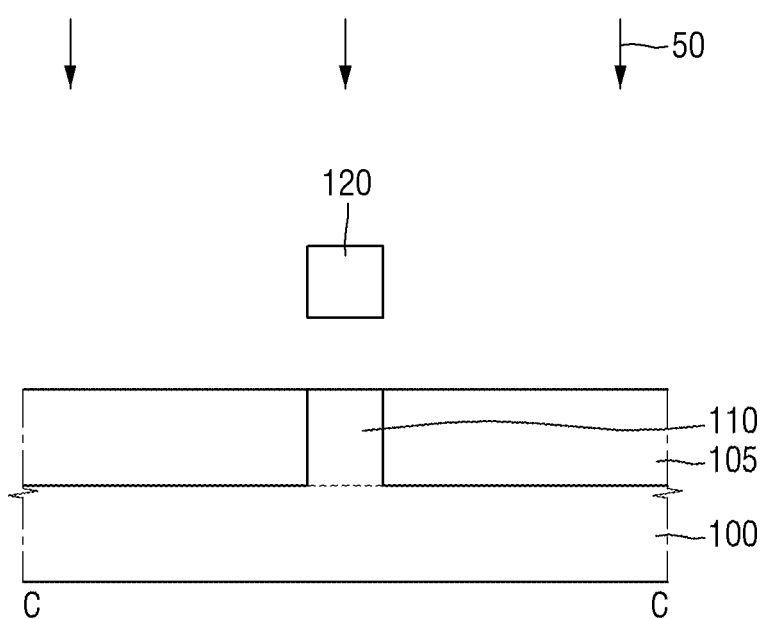

Referring to FIGS. 15 and 16, from the fin-type structure 110P exposed by the gate trench 130t, the first sacrificial pattern 121 and the second sacrificial pattern 123 may be removed with the wet etching 50.

As a result, a wire pattern 120 may be formed at a spacing from the fin-type pattern 110. The wire pattern 120 may be formed of the pre-wire pattern 122 included in the fin-type structure 110P of FIG. 13.

The wet etching 50 may be conducted by using the etching composition described above according to some example embodiments of present disclosure.

The removal of the first sacrificial pattern 121 and the second sacrificial pattern 123 may allow the inner spacer 142 of the gate spacer 140 to be exposed. That is, the inner spacer 142 may be exposed by the gate trench 130t.

Figure 18:
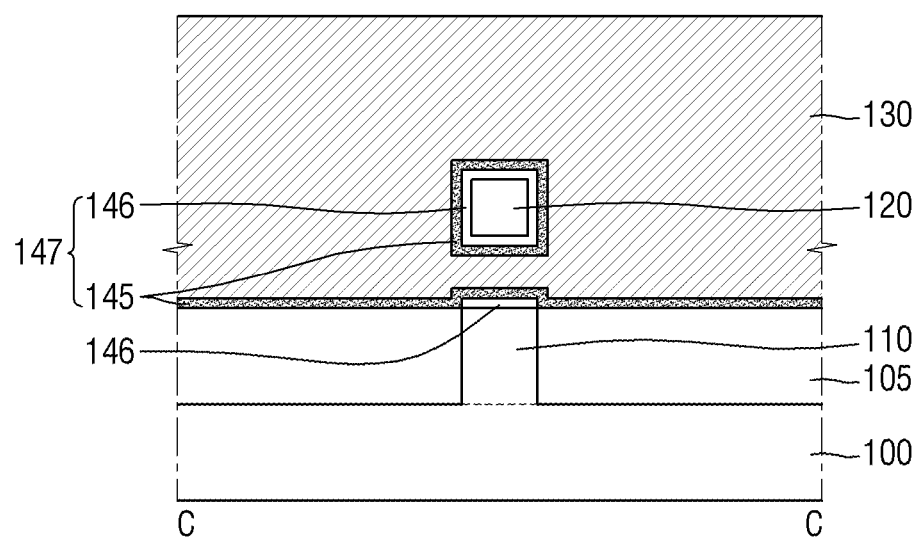

Referring to FIGS. 17 and 18, an interfacial film 146 may be formed on a perimeter of the wire pattern 120 and the upper surface of the fin-type pattern 110.

The interfacial film 146 may include, for example, silicon oxide.

Then, a high-k dielectric insulating film 145 may be formed along a perimeter of the wire pattern 120, and a sidewall and a bottom surface of the gate trench 130t. The high-k dielectric insulating film 145 may be in contact with the inner spacer 142. The high-k dielectric insulating film 145 may be formed on the interfacial film 146.

Accordingly, a gate insulating film 147 may be formed.

The high-k dielectric insulating film 145 may include one or more of, for example, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Next, the gate electrode 130 may be formed on the high-k dielectric insulating film 145, surrounding the wire pattern 120 and filling the gate trench 130t.

The gate electrode 130 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), and a combination thereof.

For example, the gate electrode 130 may be formed by a replacement process (or gate last process), but not limited hereto.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method for fabricating a semiconductor device using an etching composition, comprising: forming a fin-type structure including a silicon pattern and a silicon-germanium pattern that are alternately stacked; forming a dummy gate electrode on the fin-type structure, the dummy gate electrode intersecting the fin-type structure; forming a first spacer on a sidewall of the dummy gate electrode; forming an interlayer insulating film that surrounds a sidewall of the first spacer and exposes an upper surface of the dummy gate electrode; forming a trench exposing the fin-type structure within the interlayer insulating film, by removing the dummy gate electrode; and forming a wire pattern using the etching composition, the wire pattern including the silicon pattern, the forming the wire pattern including removing the silicon-germanium pattern with wet etching from the fin-type structure exposed by the trench, the wet etching including using the etching composition, and wherein the etching composition includes a peracetic acid mixture, a fluorine compound, an acetate series organic solvent, water and at least one silicon compound, wherein the at least one silicon compound includes one of alkoxy silane compound, silanol compound, oxime silane compound, disilazane compound, or disiloxane compound, and wherein the at least one the silicon compound is included in a range of 0.01 wt % to 5 wt % with respect to a total weight of the etching composition.

2. The method of claim 1, further comprising:
forming high-k dielectric insulating film extended along a perimeter of the wire pattern and a sidewall of the trench and a bottom surface of the trench; and
forming a gate electrode the high-k dielectric insulating film, the gate electrode surrounding the wire pattern filling the trench.

3. The method of claim 1, further comprising:
forming a recess in the fin-type structure by removing a portion of the fin-type structure that is not overlapped with the dummy gate electrode and the first spacer; and
forming a dimple using the etching composition, the forming the dimple including removing at least a portion of the silicon-germanium pattern that is exposed by the recess and overlaps with the first spacer.

4. The method of claim 3, further comprising:
forming a second spacer filling the dimple.

5. The method of claim 3, further comprising:
forming an epitaxial pattern filling the recess, wherein the epitaxial pattern contacts the silicon pattern.

6. The method of claim 1,
wherein the peracetic acid mixture includes an acetic acid solution and a hydrogen peroxide solution mixed together with a volume ratio of 33:10 to 33:33.

7. The method of claim 6,
wherein the acetic acid solution is acetic acid aqueous solution of 100 percent concentration, and
the hydrogen peroxide solution is hydrogen peroxide aqueous solution of 31 percent concentration.

8. The method of claim 1,
wherein the peracetic acid mixture is included in a range of 15 wt % to 75 wt % with respect to the total weight of the etching composition.

9. The method of claim 1,
wherein the acetate series organic solvent is included in a range of 15 wt % to 65 wt % with respect to the total weight of the etching composition.

10. The method of claim 1,
wherein the fluorine compound is included in a range of 0.01 wt % to 5 wt % with respect to the total weight of the etching composition.

11. A method for fabricating a semiconductor device using an etching composition, comprising:
forming a fin-type structure including a silicon pattern and a silicon-germanium pattern that are alternately stacked;
forming a dummy gate electrode on the fin-type structure, the dummy gate electrode intersecting the fin-type structure;
forming a first spacer on a sidewall of the dummy gate electrode;
forming an interlayer insulating film that surrounds a sidewall of the first spacer and exposes an upper surface of the dummy gate electrode;
forming a trench exposing the fin-type structure within the interlayer insulating film, by removing the dummy gate electrode; and
forming a wire pattern using the etching composition, the wire pattern including the silicon pattern, the forming the wire pattern including removing the silicon-germanium pattern with wet etching from the fin-type structure exposed by the trench, the wet etching including using the etching composition,
wherein the etching composition including a peracetic acid mixture, a fluorine compound, an organic solvent, water and at least one silicon compound,
wherein the at least one silicon compound includes one of alkoxy silane compound, silanol compound, oxime silane compound, disilazane compound, or disiloxane compound,
wherein the peracetic acid mixture is included in a range of 15 wt % to 75 wt % with respect to a total weight of the etching composition, wherein the fluorine compound is included in a range of 0.01 wt % to 5 wt % with respect to the total weight of the etching composition, and wherein the organic solvent is included in a range of 15 wt % to 65 wt % with respect to the total weight of the etching composition.

12. The method of claim 11, wherein the at least one the silicon compound is included in a range of 0.01 wt % to 5 wt % with respect to the total weight of the etching composition.

13. The method of claim 11, wherein the peracetic acid mixture includes an acetic acid solution and a hydrogen peroxide solution mixed together with a volume ratio of 33:10 to 33:33.

* * * * *